United States Patent [19]

Sugawara et al.

[11] Patent Number: 4,885,581

[45] Date of Patent: Dec. 5, 1989

[54] DIGITAL-TO-ANALOG CONVERTER CIRCUIT

[75] Inventors: Mitsutoshi Sugawara; Nami Inamasu, both of Tokyo, Japan

[73] Assignee: NEC Corporation, Tokyo, Japan

[21] Appl. No.: 161,060

[22] Filed: Feb. 26, 1988

[30] Foreign Application Priority Data

Feb. 27, 1987 [JP] Japan .................................. 62-45713
Jun. 3, 1987 [JP] Japan ................................ 62-140226

[51] Int. Cl.$^4$ .............................................. H03M 1/00
[52] U.S. Cl. ..................................... 341/145; 341/118; 341/144
[58] Field of Search ................. 340/347 DA; 341/118, 341/144, 145

[56] References Cited

U.S. PATENT DOCUMENTS

| | | | |
|---|---|---|---|
| 4,340,882 | 7/1982 | Maio et al. .................. | 340/347 DA |
| 4,523,182 | 6/1985 | Harvey et al. .............. | 340/347 DA |
| 4,617,551 | 10/1986 | Ophoff ........................ | 340/347 DA |

Primary Examiner—William M. Shoop, Jr.
Assistant Examiner—Helen Kim
Attorney, Agent, or Firm—Sughrue, Mion, Zinn, Macpeak & Seas

[57] ABSTRACT

For reduction in component elements, there is disclosed a digital-to-analog converter circuit for converting a digital input signal consisting of high-order bits and low-order bits into an analog output signal, comprising, (a) a first digital-to-analog converting circuit operative to produce a first current the amount of which corresponds to a value represented by the high-order bits, (b) a memory circuit storing an error data information in each address specified by each of values represented by the high-order bits, (c) an arithmetic circuit operative to carry out arithmetic operations on the low-order bits and the error data information to produce amended low-order bits, (d) a second digital-to-analog converting circuit operative to produce a second current the amount of which corresponds to a value represented by the amended low-order bits, and (e) an analog adder operative to add the first current weighted by a predetermined factor to the second current to produce an analog output signal, so that the analog output signal precisely corresponds to the digital input signal.

17 Claims, 7 Drawing Sheets

FIG. 1
PRIOR-ART

FIG. 2
PRIOR-ART

DIGITAL-TO-ANALOG CONVERTER CIRCUIT

FIELD OF THE INVENTION

This invention relates to a digital-to-analog converter circuit and, more particularly, to a regulation circuit for matching a piece of digital input data information to a piece of analog output data information.

BACKGROUND OF THE INVENTION

Figure 1:
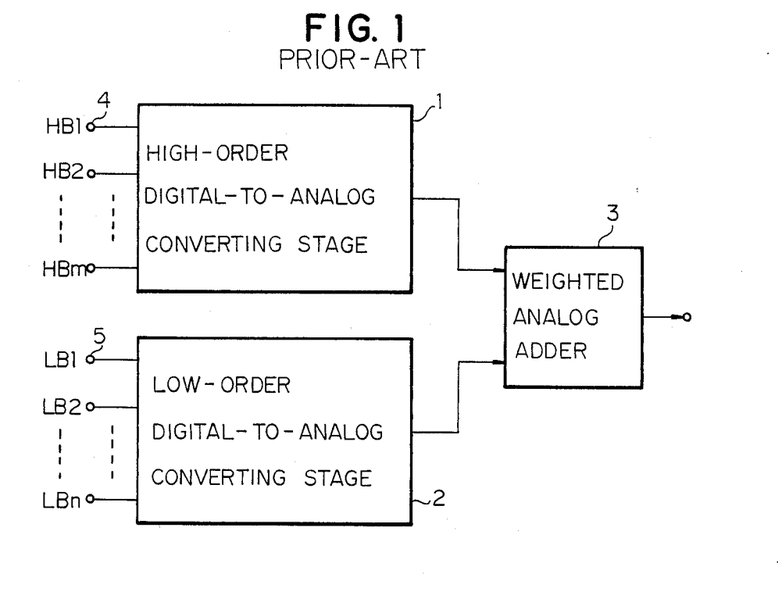
FIG. 1 is a block diagram showing the circuit arrangement of a prior-art digital-to-analog converter circuit.

A typical example of the digital-to-analog converter circuit is illustrated in FIG. 1 and comprises a high-order digital-to-analog converting stage 1, a low-order digital-to-analog converting stage 2, and a weighted analog adder 3. In operation, high-order m-bits HB1 to HBm of a digital signal are supplied to the input nodes 4 of the high-order digital-to-analog converting stage 1, and low-order n-bits LB1 to LBn of the digital signal are concurrently supplied to the input nodes 5 of the low-order digital-to-analog converting stage 2. Each of the high-order digital-to-analog converting stage 1 and the low-order digital-to-analog converting stage 2 is formed to have a circuit arrangement well-known in the art such as, for example, a resistive ladder, so that no further description will be incorporated.

When the digital signal is applied to the input nodes 4 and the high-order digital-to-analog converting stage 1 is operative to produce a current the amount of which corresponds to a value represented by the high-order bits of the digital signal, likewise the low-order digital-to-analog converting stage 2 is operative to produce a current the amount of which corresponds to a value represented by the low-order bits of the digital signal. The current fed from the high-order digital-to-analog converting stage 1 is added to the current fed from the high-order digital-to-analog converting stage 3 by the analog adder 4, and the current fed from the high-order digital-to-analog converting stage 1 is weighted in the analog adder 3 to have a value which increased by a factor of $2^n$ with respect to the current fed from the low-order digital-to-analog converting stage 2. The digital-to-analog converter circuit thus arranged produces the total amount of current which corresponds to a value represented by the input digital signal supplied thereto, and the total amount of current is supplied from the output node of the analog adder 3 to an electric circuit (not shown).

However, a problem had been encountered in the prior-art digital-to-analog converter circuit illustrated in FIG. 1 in that the number of bits is limited in view of accuracy of the conversion. In detail, a digital-to-analog converter is allowed to have the driftage of the output current only less than a half of the smallest increment, and the smallest increment is equivalent to the value represented by the least significant bit of the input digital signal. For this reason, the prior-art digital-to-analog converter circuit should have an accuracy of $\frac{1}{2}^{m+n}$. If the input digital signal consists of 8 bits i.e., m=4 and n=4, the accuracy is calculated as $\frac{1}{2}^8 \times 100 = 0.4\%$, and, in the case of the 18-bit input digital signal, the accuracy should be 0.0004%. It is impossible to realize these accuracies without any trimming of component element such as the resistive ladder.

Figure 2:
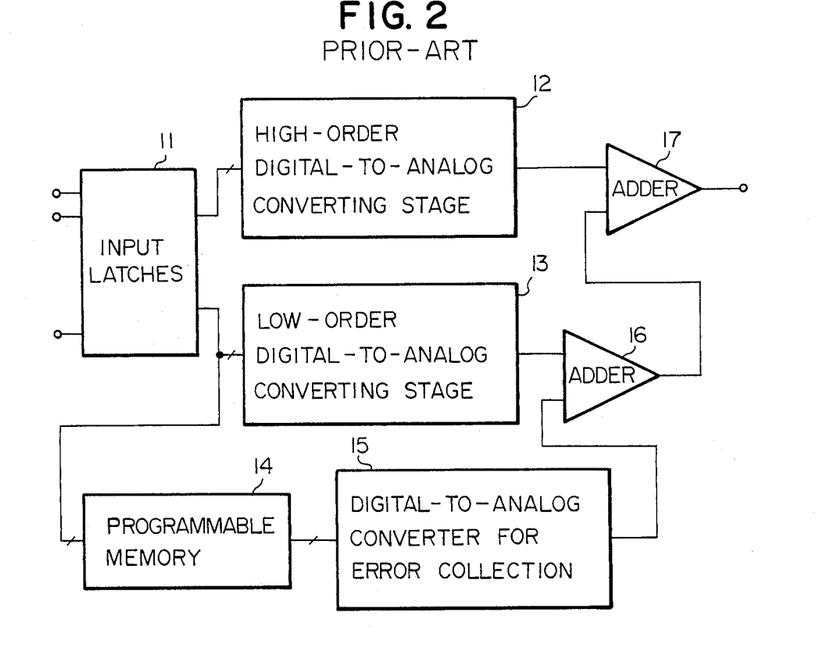
FIG. 2 is a block diagram showing the circuit arrangement of another prior-art digital-to-analog converter circuit disclosed in Japanese patent application laid-open No. 168522/1982.

One of the approaches to form the digital-to-analog converter circuit without any trimming has been disclosed in Japanese patent application laid-open (Kokai) No. 168522/1982. The circuit arrangement of the digital-to-analog converter circuit disclosed in the Japanese patent application laid-open is illustrated in FIG. 2 of the drawings and largely comprises an input latches 11 for temporary storing an input digital signal, a high-order digital-to-analog converting stage 12 supplied from the input latches 11 with high-order bits of the input digital signal to produce a current corresponding to a value represented by the high-order bits of the input digital signal, a low-order digital-to-analog converting stage 13 supplied from the input latches 11 with low-order bits of the input digital signal to produce a current corresponding to a value represented by the low-order bits, a programmable read-only memory 14 such as an erasable programmable read-only memory storing digital data for error correction, an auxiliary digital-to-analog converting stage 15 supplied from the programmable memory 14 with the digital data and producing a correction current corresponding to the error value inherent in this digital-to-analog converter circuit, an analog adder 16 supplied with the currents fed from the low-order digital-to-analog converter stage 13 and the digital-to-analog converter stage 15 for error correction, and an analog adder 17 supplied with the currents fed from the analog adder 16 and the high-order digital-to-analog converter stage 12 to produce an output current corresponding to a value represented by the input digital signal. The digital-to-analog converter circuit thus arranged is free from the expensive trimming process, because the programmable memory 14 preserves the digital data representative of the error values inherent in that digital-to-analog converter circuit for production of the correction current.

However, another problem is encountered in the digital-to-analog converter circuit disclosed in the above mentioned patent application laid-open in circuit complexity and, accordingly, the number of component element. This is because of the fact that the correction current produced by the digital-to-analog converter stage 15 on the basis of the digital data supplied from the programmable memory 14 is added to the current produced by the low-order digital-to-analog converting stage.

SUMMARY OF THE INVENTION

It is therefore an important object of the present invention to provide a digital-to-analog converter circuit which is free from the expensive trimming process.

It is also an important object of the present invention to provide a digital-to-analog converter circuit which has a simple circuit arrangement for regulation of an analog output signal.

To accomplish these objects, the present invention proposes to add correction bits to low-order bits of an input digital signal.

In accordance with the present invention, there is provided a digital-to-analog converter circuit for converting a digital input signal into an analog output signal, the digital input signal consisting of high-order bits representing one of plural values and low-order bits including the least significant bit, comprising, (a) first digital-to-analog converting means operative to produce a first analog signal the amount of which corresponds to one of the plural values, (b) memory means having a plurality of addresses each storing a piece of error data information in the digital form for each of the plural values, one of the addresses being specified by the high-order bits for reading out the piece of error data information stored therein, (c) arithmetic means operative to carry out an arithmetic operation on the low-order bits and the piece of error data information to produce an amended low-order bits, (d) second digital-to-analog converting means operative to produce a second analog signal the amount of which corresponds to a value represented by the amended low-order bits, and (e) an analog adder operative to add the first analog signal to the second analog signal to produce an analog output signal, the first analog signal being weighted by a predetermined factor in the analog adder. Each of the pieces of error data information may have a value determined in terms of the value of the least significant bit. The analog signals may be represented by currents, respectively. The memory means may be formed by a read only memory, a programmable read only memory such as, for example, fusible-link type or a random access memory, but, in the case of the implementation using the random access memory, the digital-to-analog converting circuit further comprises a processing means operative to execute a corrective operation on the first digital-to-analog converting means so as to form the pieces of error data information. The programmable read only memory may comprise a plurality of memory cells associated with the addresses, a write-in circuit supplied with the piece of error data information for fixedly writing the piece of error data information into the addresses, respectively, and a read-out circuit operative to read out one of the pieces of error data information specified by the high-order bits, if each of the pieces of error data information is represented by a predetermined number of error data bits, the read-out circuit may comprise an address counter responsive to a clock signal and operative to specify the error data bits of the piece of error data information in succession, a single sense amplifier supplied with the error data bits of the piece of error data information in succession and operative to decide a logic level of each error data bit, and a serial-in-parallel-out shift register supplied in succession with the error data bits of the piece of error data information fed from the sense amplifier and operative to simultaneously transfer the error data bits of the piece of error data information to the arithmetic means. The error data bits may be equal in number to the low-order bits.

The arithmetic means may be formed by an adder-subtracter or a full adder having a plurality of input nodes smaller in number than output nodes thereof coupled in parallel to input nodes of the second digital-to-analog converting means by one. In the case of implementation using the adder, a certain positive number may be added to each pieces of error data information and, accordingly, the analog adder may be accompanied by a level shifting circuit.

BRIEF DESCRIPTION OF THE DRAWINGS

The features and advantages of a digital-to-analog converter circuit according to the present invention will be more clearly understood from the following description taken in conjunction with the accompanying drawings in which.

DESCRIPTION OF THE PREFERRED EMBODIMENTS

First Embodiment

Figure 3:
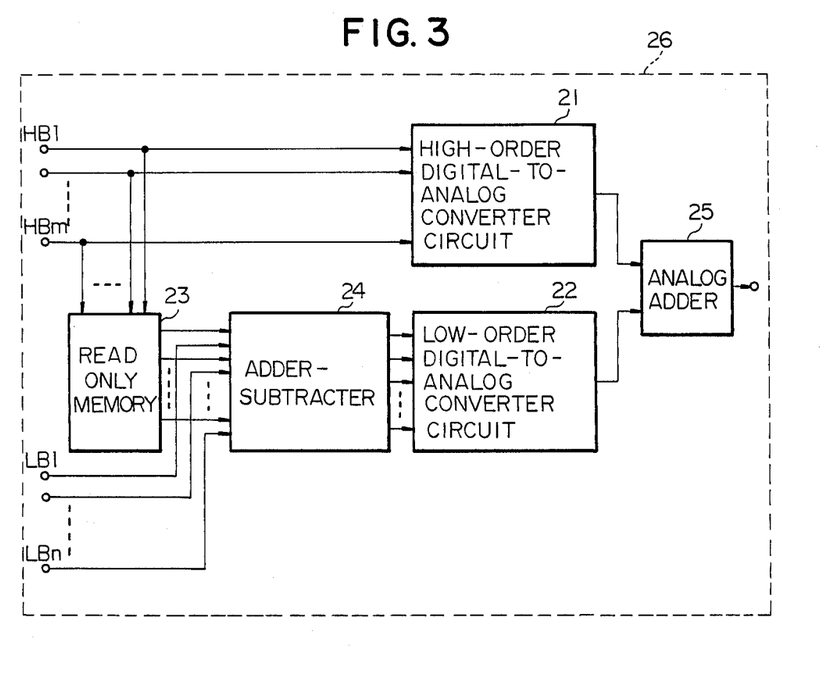
FIG. 3 is a block diagram showing the circuit arrangement of a first embodiment of a digital-to-analog converter circuit according to the present invention.

Referring first to FIG. 3 of the drawings, there is shown the circuit arrangement of a digital-to-analog converting circuit which comprises a high-order digital-to-analog converter circuit 21 serving as first digital-to-analog converting means, a low-order digital-to-analog converting circuit 22 serving as second digital-to-analog converting means, a read only memory 23 serving as memory means, an adder-subtracter 24 serving as arithmetic means, and an analog adder 25. All of the circuits and memory 21 to 25 are fabricated on a single semiconductor chip 26, typically a silicon chip, together with electric circuits (not shown) using an analog output signal fed from the analog adder 25.

The high-order digital-to-analog converter circuit 21 is supplied with high-order m-bits HB1 to HBm of a digital input signal and operative to produce a first current the amount of which corresponds to a value represented by the m-bits of the digital input signal. The high-order digital-to-analog converter circuit 21 is supplied with the m-bits of the digital input signal, so that the high-order bits represents one of $2^m$ values. Then, the amount of first current produced by the converter circuit 21 is stepwise increased by the increment in value.

The high-order m-bits are simultaneously supplied to the read only memory 23 as an address signal, and the read only memory 23 had $2^m$ memory addresses each fixedly storing an n-bit piece of error data information. The n-bit error data information represents a deviation from the theoretical amount of first current in terms of a value represented by the least significant bit of the digital input signal or the lowest bit of low-order n-bits LB1 to LBn. The read only memory 23 thus arranged supplies one of the n-bit pieces of error data informations stored in the address specified by the high-order bits to first input nodes of the adder-subtracter 24. The adder-subtracter 24 further has second input nodes where the low-order n-bits of the digital input signal are supplied, so that the adder-subtracter 24 caries out an arithmetic operation, either addition or subtraction depending upon the n-bit error data information, on the n-bit error data information and the low-order bits LB1 to LBn to form an amended low-order bits.

The low-order digital-to-analog converter circuit 22 is supplied with the amended low-order bits fed from the adder-subtracter 24 and operative to produce a second current the amount of which corresponds to a value represented by the amended low-order bits. Each of the digital-to-analog converter circuit 21 or 22 largely comprises a switching circuit associated with a decoder circuit and a resistor network, however the circuit arrangement of each digital-to-analog converter circuit 21 or 22 is well known in the art, so that no further description will be incorporated.

Both of the first and second currents are supplied to the analog adder 25, and the first current is weighted by a predetermined factor so as to cause the amount of first current to correspond to the high-order bits HB1 to HBm. As described above, the amended low-order bits reflects the piece of error data information, so that an analog output signal fed from the analog adder 25 precisely corresponds to the digital input signal. Of course, no correction is made for the low-order digital-to-analog converter circuit 22, however the digital-to-analog converter circuit illustrated in FIG. 3 is improved in accuracy to be $\frac{1}{2}^n$ times better than the prior-art digital-to-analog converter circuit without trimming. Moreover, no digital-to-analog converter circuit for correction use is incorporated in the digital-to-analog converter circuit illustrated in FIG. 3, so that the circuit arrangement is simplified with respect to the digital-to-analog converter circuit disclosed in Japanese patent application laid-open No. 168522/1982.

Second Embodiment

Figure 4:
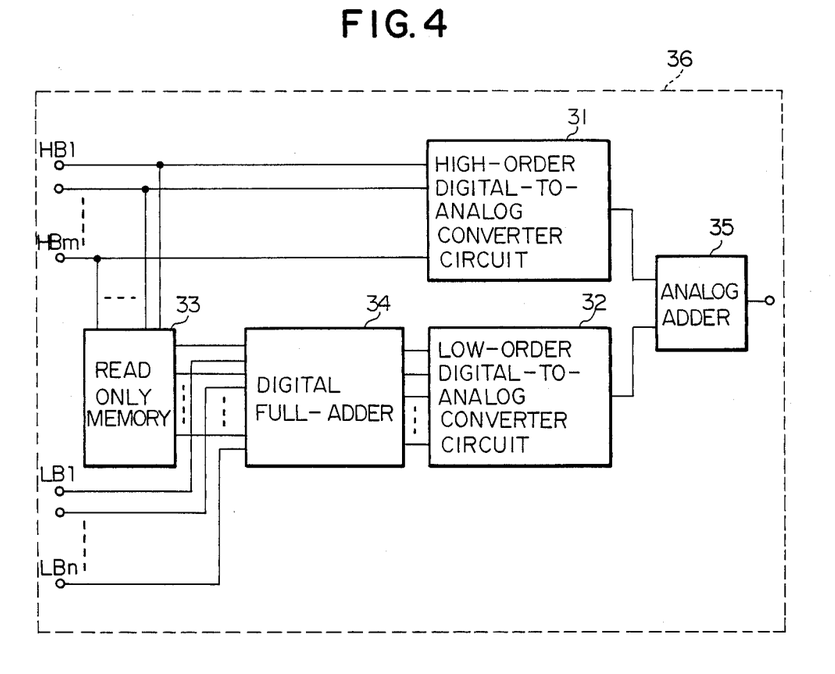
FIG. 4 is a block diagram showing the circuit arrangement of a second embodiment of a digital-to-analog converter circuit according to the present invention.

Turning to FIG. 4 of the drawings, another circuit arrangement of a digital-to-analog converter circuit embodying the present invention is illustrated and largely comprises a high-order digital-to-analog converter circuit 31 serving as first digital-to-analog converting means, a low-order digital-to-analog converting circuit 32 serving as second digital-to-analog converting means, a programmable read only memory 33 serving as memory means, a digital adder 34 serving as arithmetic means, and an analog adder 35. All of the circuits and memory 31 to 35 are fabricated on a single semiconductor chip 36, typically a silicon chip, together with electric circuits (not shown) using an analog output signal fed from the analog adder 35.

In this implementation, the high-order digital-to-analog converter circuit 31, the low-order digital-to-analog converter circuit 32, read only memory 33 and the analog adder 35 are similar in construction to those of the digital-to-analog converter circuit illustrated in FIG. 3, so that detailed description for those circuits is omitted for the sake of simplicity. The digital-to-analog converter circuit illustrated in FIG. 4 is characterized by the digital adder 34, then description will be focused upon the digital adder 34. The digital adder 34 has two sets of input nodes each consisting of a error data information and the low-order bits of the input digital signal are supplied to the two sets of input nodes. With the error data bits and the low-order bits, the digital adder performs an addition to produce an amended low-order bits. This addition sometimes results in an amended low-order bits consisting of a certain bits more than the input data bits because of a carry bit, so that the digital adder 35 has output nodes increased in number than the input nodes by one, and the digital adder serves as a full adder. The output nodes of the digital adder 34 are coupled in parallel to the input nodes of the low-order digital-to-analog converter circuit 32.

In operation, when an digital input signal is supplied to the digital-to-analog converter circuit illustrated in FIG. 4, the high-order bits HB1 to HBm are supplied in parallel to the input nodes of the high-order digital-to-analog converter circuit 31 and to the address nodes of the memory cells 37. With the high-order bits HB1 to HBm of the digital input signal, a piece of error data information corresponding to the value represented by the high-order bits are read out from the memory cells 37. The piece of error data information is transferred to the full adder 34. The low-order bits of the digital input signal have been already supplied, so that the error data bits are added to the low-order bits of the digital input signal to produce an amended low-order bits. As a result of the addition, the amended low-order bits may include a carry bit. The amended low-order bits are supplied to the low-order digital-to-analog converter circuit 32, and a second current takes place at the output node of the low-order digital-to-analog converter circuit 32 based on the amended low-order bits. A first current also takes place at the output node of the high-order digital-to-analog converter circuit 31. The first current is weighted by a predetermined factor so as to reflect the value of the high-order bits in the digital input signal. Then, the analog adder 35 delivers an analog output signal the amount of which corresponds to the value represented by the digital input signal.

In a modification, the digital adder 34 may be replaced by a digital subtracter, and, similarly, the output nodes of the subtracter are arranged to be different in number to the input nodes thereof.

Third Embodiment

Figure 5:
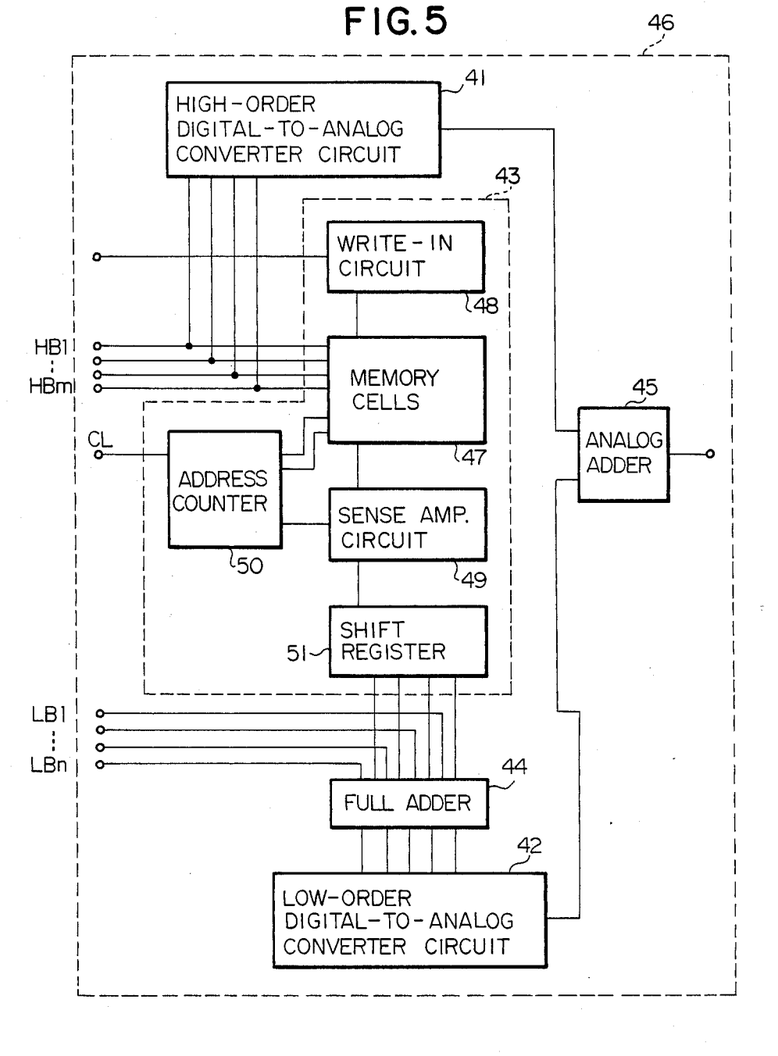
FIG. 5 is a block diagram showing the circuit arrangement of a third embodiment of a digital-to-analog converter circuit according to the present invention.

Turning to FIG. 5 of the drawings, another circuit arrangement of a digital-to-analog converter circuit embodying the present invention is illustrated and largely comprises a high-order digital-to-analog converter circuit 41 serving as first digital-to-analog converting means, a low-order digital-to-analog converting circuit 42 serving as second digital-to-analog converting means, a programmable read only memory 43 serving as memory means, a full adder 44 serving as arithmetic means, and an analog adder 45. All of the circuits and memory 41 to 45 are fabricated on a single semiconductor chip 46, typically a silicon chip, together with electric circuits (not shown) using an analog output signal fed from the analog adder 35.

In this implementation, the high-order digital-to-analog converter circuit 41, the low-order digital-to-analog converter circuit 42, the full adder 44 and the analog adder 45 are similar in construction to those of the digital-to-analog converter circuit illustrated in FIG. 4, so that no further description for those circuits is hereinunder incorporated for the sake of simplicity. The digital-to-analog converter circuit illustrated in FIG. 5 is characterized by the programmable read only memory 43, then description will be focused upon the programmable read only memory 43. The programmable read only memory 43 comprises a plurality of memory cells 47 grouped by four corresponding to four error data bits of a piece of error data information, a write-in circuit 48 operative to write each error data information into each of the addresses, a single sense amplifier circuit 49 capable of decide a logic level, a high-logic level or a low-logic level, of an error data bit, an address counter 50 responsive to a clock signal CL to allow the four error data bits of a piece of error data information to be serially transferred from the memory cells 47 to the sense amplifier circuit 49, and a serial-in-parallel-out shift register circuit 51. Each of the memory cells 47 is of the fusible-link type, however another type of memory cells such as, for example, a floating-gate type may be used in another implementation. The piece of error data information stored in the memory cells has a value representing the total sum of the deviation from the theoretical amount of the first current and a certain positive value. The deviation is determined in terms of the value of the least significant bit, and the positive value is selected in such a manner that no negative total sum is avoided. The programmable read only memory 43 thus arranged operates with a source of single voltage level, so that the circuit arrangement is simplified in comparison with the implementation using the adder-subtracter. The digital-to-analog converter circuit illustrated in FIG. 5 is further advantageous in reduction in occupation area. This is because of the fact that only one sense amplifier circuit 49 is incorporated in the memory 43. In general, if the memory cells 47 are relatively small in number, the peripheral circuits such as a sense amplifier circuit occupies a larger amount of area in comparison with the memory cells. In this instance, the memory cells 47 are formed by $2^4 \times 4 = 64$ cells, so that reduction of the peripheral circuit is conducive to reducing the occupation area. Although the single sense amplifier circuit 49 is necessary to be accompanied by the address counter circuit 50 and the shift register circuit 51, three sense amplifier circuits are removed from the memory 43, thereby being capable of reduction in occupation area.

On the other hand, the full adder 44 has two sets of input nodes each consisting of four nodes, and the four error data bits of the piece of error data information and the four low-order bits of the input digital signal are supplied to the two sets of input nodes. With the error data bits and the low-order bits, the full adder performs an addition to produce an amended low-order bits. This addition sometimes results in an amended low-order bits consisting of five bits, so that the full adder has five output nodes coupled in parallel to the input nodes of the low-order digital-to-analog converter circuit 42.

In operation, when a digital input signal is supplied to the digital-to-analog converter circuit illustrated in FIG. 5, the high-order bits HB1 to HBm are supplied in parallel to the input nodes of the high-order digital-to-analog converter circuit 41 and to the address nodes of the memory cells 47. With the high-order bits HB1 to HBm of the digital input signal, a piece of error data information corresponding to the value represented by the high-order bits are read out from the memory cells 47. The address counter circuit 50 allows the error data bits of the piece of error data information to be serially transferred to the sense amplifier circuit 49 in response to the clock signal CL, so that the error data bits are supplied in succession to the sense amplifier circuit 49, thereby being decided the logic level thereof. Each of the error data bits is supplied to the serial-to-parallel shift register circuit 51 after decision of the logic level thereof and stored in the serial-to-parallel shift register circuit 51. When all of the error data bits are stored in the shift register circuit 51, the piece of error data information is transferred to the full adder 44. The low-order bits of the digital input signal have been already supplied, so that the error data bits are added to the low-order bits LB1 to LBn of the digital input signal to produce an amended low-order bits. As a result of the addition, the amended low-order bits may include a carry bit, then the total number of the amended low-order bits are selected to be five. The amended low-order bits are supplied to the low-order digital-to-analog converter circuit 42, and a second current takes place at the output node of the low-order digital-to-analog converter circuit 42 based on the amended low-order bits. A first current also takes place at the output node of the high-order digital-to-analog converter circuit 41. The first current is weighted by a predetermined factor so as to reflect the value of the high-order bits in the digital input signal. Then, the analog adder 45 delivers an analog output signal the amount of which does not correspond to the value represented by the digital input signal, because a small amount of current corresponding to the certain positive value is included in the analog output signal. This means that the analog output signal includes a constant d.c. current, however the constant d.c. current does not affect an operation of a certain electric application such as, for example, an audiofrequency system.

Fourth Embodiment

Figure 6:
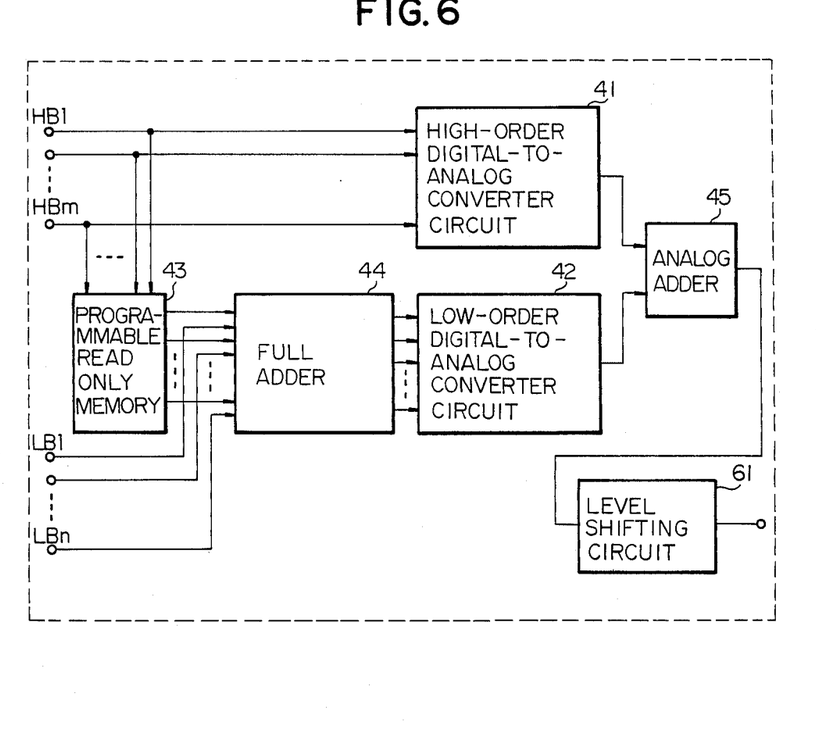
FIG. 6 is a block diagram showing the circuit arrangement of a fourth embodiment of a digital-to-analog converter circuit according to the present invention.

Turning to FIG. 6 of the drawings, there is shown the circuit arrangement of a digital-to-analog converter circuit according to the present invention. The digital-to-analog converter circuit illustrated in FIG. 6 is similar in construction to the digital-to-analog converter circuit illustrated in FIG. 5 except for the level shifting circuit 61, so that circuits corresponding to those denoted by reference numerals 41 to 45 are designated by the same reference numerals and detailed description will be omitted for the sake of simplicity. The analog adder 45 is coupled to the level shifting circuit 61, and the circuit arrangement of the level shifting circuit 61 is well known in the art, so that no further description thereof is incorporated.

As described hereinbefore, the analog output signal of the analog adder 45 includes a constant d.c. current, and this d.c. current does not affect some application such as an audiofrequency device. However, it is better to eliminate the d.c. current from the analog output signal in some application, so that the level shifting circuit 61 is arranged to cancel the d.c. current caused by the pieces of predetermined value in each of the error data information. As a result, the digital-to-analog converter circuit illustrated in FIG. 6 can find wide applications.

Fifth Embodiment

Figure 7:
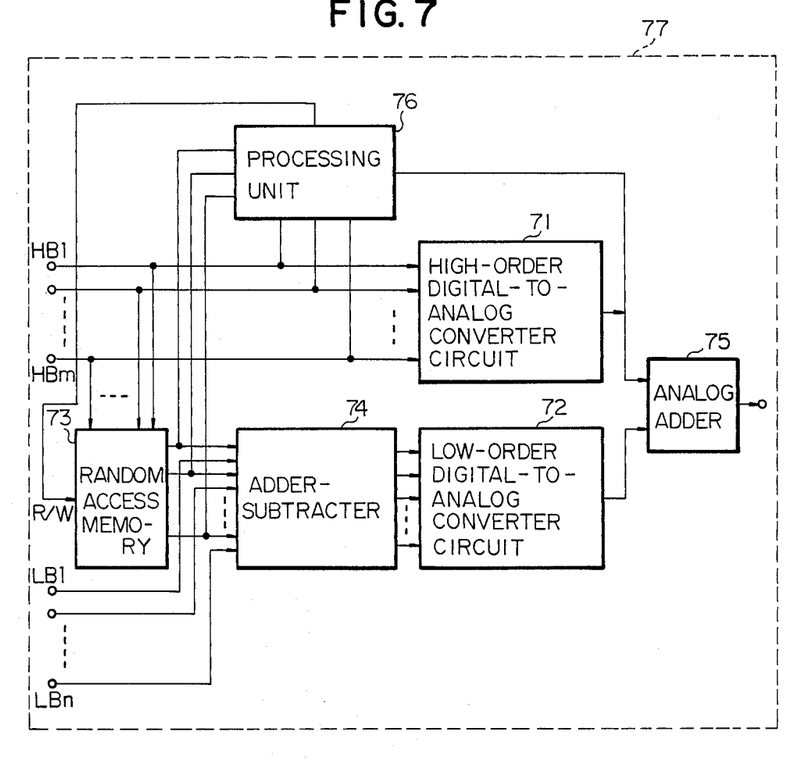
FIG. 7 is a block diagram showing the circuit arrangement of a fifth embodiment of a digital-to-analog converter circuit according to the present invention.

Turning to FIG. 7 of the drawings, another digital-to-analog converter circuit is illustrated and largely comprises a high-order digital-to-analog converter circuit 71 serving as first digital-to-analog converting means, a low-order digital-to-analog converting circuit 72 serving as second digital-to-analog converting means, a random access memory 73 serving as memory means, an adder-subtracter 74 serving as arithmetic means, an analog adder 75, and a processing unit 76. All of the circuits and memory 71 to 76 are fabricated on a single semiconductor chip 77, typically a silicon chip, together with electric circuits (not shown) using an analog output signal fed from the analog adder 75.

In this implementation, the high-order digital-to-analog converter circuit 71, the low-order digital-to-analog converter circuit 72, the adder-subtracter 74 and the analog adder 75 are similar in construction to those of the digital-to-analog converter circuit illustrated in FIG. 3, so that no further description for those circuits is hereinunder incorporated for the sake of simplicity. The digital-to-analog converter circuit illustrated in FIG. 7 is characterized by the random access memory 73 and the processing unit 76, then description will be focused upon the random access memory 73 and the processing unit 76. The random access memory 73 is capable of shifting between a write-in operation and a read-out operation in response to a read/write control signal R/W, and have address nodes coupled in parallel to the high-order bits HB1 to HBm of the digital input signal and data input/output nodes coupled to the input nodes of the adder-subtracter 74. The random access memory 73 can preserve a plurality of pieces of error data information each corresponding to plural values represented by the high-order bits HB1 to HBm in the addresses, respectively.

On the other hand, the processing unit can execute a corrective operation to produce the piece of error data information each representing a deviation between the actual amount of current flowing from the high-order digital-to-analog converter circuit 71 and the theoretical amount of current expected. In this implementation, the processing unit 76 is implemented by a small-size processor, a programmed instruction storage and other necessary circuits for the corrective operation. In detail, when the digital-to-analog converter circuit is actuated, the processing unit 76 immediately starts the corrective operation. Namely, the processing unit 76 produces the high-order bits of (0000) and, thereafter, supplies the high-order bits to both of the input nodes of the high-order digital-to-analog converter circuit 71 and the address nodes of the random access memory 73. Then, the high-order digital-to-analog converter circuit 71 produces a first current the amount of which corresponds to value (0000), and the first current is supplied to the processing unit 76 for comparing the first current with the theoretical value. As a result of the comparison, a deviation is detected, and an error data information in the digital form is formed on the basis of the detection. The processing unit 76 has supplied the read/write control signal R/W representative of write-in operation to the random access memory 73, so that the piece of error data information is supplied from the processing unit 76 to the random access memory for preserving. The piece of error data information for value (0000) has been preserved in the random access memory 73, the processing unit 76 increases the high-order bits to value (0001), and, repeats the aforesaid steps for preserving the piece of error data information for value (0001). In this way, all of the pieces of error data information are written in the random access memory 73, then the processing unit 76 shifts the read/write control signal R/W from the write-in state to the read-out state, thereby starting the usual converting operation.

In the usual converting operation, when an digital input signal is supplied to the digital-to-analog converter circuit illustrated in FIG. 7, the high-order bits HB1 to HBm of the digital input signal are supplied in parallel to the input nodes of the high-order digital-to-analog converter circuit 71 and to the address nodes of the random access memory 73. With the high-order bits HB1 to HBm of the digital input signal, a piece of error data information corresponding to the value represented by the high-order bits HB1 to HBm are read out from the random access memory 73, and the piece of error data information is transferred to the adder-subtracter 74. The low-order bits of the digital input signal have been already supplied, so that the error data bits are added or subtracted from the low-order bits LB1 to LBn of the digital input signal to produce an amended low-order bits. The amended low-order bits are supplied to the low-order digital-to-analog converter circuit 72, and a second current takes place at the output node of the low-order digital-to-analog converter circuit 72 based on the amended low-order bits. A first current also takes place at the output node of the high-order digital-to-analog converter circuit 71, and the first current is weighted by a predetermined factor so as to reflect the value of the high-order bits HB1 to HBm in the digital input signal. Then, the analog adder 45 delivers an analog output signal the amount of which corresponds to the value represented by the digital input signal.

Although particular embodiment of the present invention have been shown and described, it will be obvious to those skilled in the art that various changes and modifications may be made without departing from the spirit and scope of the present invention.

What is claimed is:

1. A digital-to-analog converting circuit for converting a digital input signal into an analog output signal, said digital input signal consisting of high-order bits representing one of plural values and low-order bits including the least significant bit, comprising:
    (a) first digital-to-analog converting means operative to produce a first analog signal the amount of which corresponds to one of said plural values;
    (b) memory means having a plurality of addresses each storing a piece of error data information in the digital form for each of said plural values, one of said addresses being specified by said high-order bits for reading out the piece of error data information stored therein;
    (c) arithmetic means operative to carry out an arithmetic operation on said low-order bits provided in the digital form and said piece of error data information provided in the digital form to produce an amended low-order bits in the digital form;
    (d) second digital-to-analog converting means supplied with said amended low-order bits in the digital form and operative to produce a second analog signal the amount of which corresponds to a value represented by said amended low-order bits; and
    (e) an analog adder operative to add said first analog signal to said second analog signal to produce an analog output signal, said first analog signal being weighted by a predetermined factor in said analog adder.

2. A digital-to-analog converting circuit as set forth in claim 1, in which said memory means are formed by a random access memory, wherein said digital-to-analog converting circuit further comprises processing means operative to execute a corrective operation on said first digital-to-analog means so as to form said error data informations.

3. A digital-to-analog converting circuit as set forth in claim 1, in which said arithmetic means are formed by an adder.

4. A digital-to-analog converter circuit as set forth in claim 1, in which said analog adder is coupled to a level shifting circuit.

5. A digital-to-analog converting circuit as set forth in claim 1, in which said error data information has a plurality of error data bits equal in number to said low-order bits, wherein said arithmetic means are formed by a full adder having a plurality of output nodes greater in number than input nodes thereof by one, said output nodes of said full adder being coupled in parallel to input nodes of said second digital-to-analog means.

6. A digital-to-analog converting circuit as set forth in claim 1, in which each of said first and second analog signals is represented by the amount of current.

7. A digital-to-analog converting circuit for converting a digital input signal into an analog output signal, said digital input signal consisting of high-order bits representing one of plural values and low-order bits including the least significant bit, comprising:
   (a) first digital-to-analog converting means operative to produce a first analog signal the amount of which corresponds to one of said plural values;
   (b) memory means having a plurality of addresses each storing a piece of error data information in the digital form for each of said plural values, one of said addresses being specified by said high-order bits for reading out the piece of error data information stored therein;
   (c) arithmetic means operative to carry out an arithmetic operation on said low-order bits and said piece of error data information to produce an amended low-order bits;
   (d) second digital-to-analog converting means operative to produce a second analog signal the amount of which corresponds to a value represented by said amended low-order bits; and
   (e) an analog adder operative to add said first analog signal to said second analog signal being weighted by a predetermined factor in said analog adder,
   wherein said arithmetic means are formed by an adder.

8. A digital-to-analog converting circuit as set forth in claim 7, in which each of said pieces of error data information has a value determined in terms of the value of said least significant bit.

9. A digital-to-analog converting circuit as set forth in claim 7, in which said memory means are formed by a read only memory.

10. A digital-to-analog converting circuit as set forth in claim 7, in which said memory means are formed by a programmable read only memory.

11. A digital-to-analog converting circuit as set forth in claim 10, in which said programmable read only memory comprises a plurality of memory cells associated with said addresses, a write-in circuit supplied with said error data informations for fixedly writing the error data information into said addresses, respectively, and an read-out circuit operative to read out one of said error data informations specified by high-order bits.

12. A digital-to-analog converting circuit as set forth in claim 11, in which each of said memory cells is of the fusible-link type.

13. A digital-to-analog converting circuit for converting a digital input signal into an analog output signal, said digital input signal consisting of high-order bits representing one of plural values and low-order bits including the least significant bit, comprising:
   (a) first digital-to-analog converting means operative to produce a first analog signal the amount of which corresponds to one of said plural values;
   (b) memory means having a plurality of addresses each storing a piece of error data information in the digital form for each of said plural values, one of said addresses being specified by said high-order bits for reading out the piece of error data information stored therein;
   (c) arithmetic means operative to carry out an arithmetic operation on said low-order bits and said piece of error data information to produce an amended low-order bits;
   (d) second digital-to-analog converting means operative to produce a second analog signal the amount of which corresponds to a value represented by said amended low-order bits; and
   (e) an analog adder operative to add said first analog signal to said second analog signal to produce an analog output signal, said first analog signal being weighted by a predetermined factor in said analog adder,
   wherein said memory means are formed by a programmable read only memory, and said programmable read only memory comprises a plurality of memory cells associated with said addresses, a write-in circuit supplied with said pieces of error data information for fixedly writing the error data information into said addresses, respectively, and an read-out circuit operative to read out one of said pieces of error data information specified by said high-order bits.

14. A digital-to-analog converting circuit as set forth in claim 13, in which each of said pieces of error data information is represented by a predetermined number of error data bits, wherein said read-out circuit comprises an address counter responsive to a clock signal and operative to specify the error data bits of said piece of error data information in succession, a single sense amplifier supplied with the error data bits of said piece of error data information in succession and operative to decide a logic level of each error data bit, and a serial-in-parallel-out shift register supplied in succession with the error data bits of said piece of error data information fed from the sense amplifier and operative to simultaneously transfer the error data bits of said piece error data information to said arithmetic means.

15. A digital-to-analog converting circuit as set forth in claim 14, in which said error data bits are equal in number to said low-order bits.

16. A digital-to-analog converting circuit for converting a digital input signal into an analog output signal, said digital input signal consisting of high-order bits representing one of plural values and low-order bits including the least significant bit, comprising:
   (a) first digital-to-analog converting means operative to produce a first analog signal the amount of which corresponds to one of said plural values;
   (b) memory means having a plurality of addresses each storing a piece of error data information in the digital form for each of said plural values, one of said addresses being specified by said high-order bits for reading out the piece of error data information stored therein;
   (c) arithmetic means operative to carry out an arithmetic operation on low-order bits and said piece of error data information to produce an amended low-order bits;
   (d) second digital-to-analog converting means operative to produce a second analog signal the amount of which is corresponds to a value represented by said amended low-order bits; and
   (e) an analog adder operative to add said first analog signal to said second analog signal to produce an analog output signal, said first analog signal being weighted by a predetermined factor in said analog adder, wherein said memory means are formed by a random access memory, and wherein said digital-to-analog converting circuit further comprises processing means operative to execute a corrective operation on said first digital-to-analog means so as to form said pieces of error data information.

17. A digital-to-analog converting circuit for converting a digital input signal into an analog output signal, said digital input signal consisting of high-order bits representing one of plural values and low-order bits including the least significant bit, comprising:
   (a) first digital-to-analog converting means operative to produce a first analog signal the amount of which corresponds to one of said plural values;
   (b) memory means having a plurality of addresses each storing a piece of error data information in the digital form for each of said plural values, one of said addresses being specified by said high-order bits for reading out the piece of error data information stored therein;
   (c) arithmetic means operative to carry out an arithmetic operation on said low-order bits and said piece of error data information to produce an amended low-order bits;
   (d) second digital-to-analog converting means operative to produce a second analog signal the amount of which corresponds to a value represented by said amended low-order bits; and
   (e) an analog adder operative to add said first analog signal to said second analog signal to produce an analog output signal, said first analog signal being weighted by a predetermined factor in said analog adder,
wherein said piece of error data information has a plurality of error data bits equal in number to said low-order bits, and wherein said arithmetic means are formed by a full adder having a plurality of output nodes greater in number than input nodes thereof by one, said output nodes of said full adder being coupled in parallel to input nodes of said second digital-to-analog means.

* * * * *

UNITED STATES PATENT AND TRADEMARK OFFICE
CERTIFICATE OF CORRECTION

PATENT NO. : 4,885,581

DATED : December 5, 1989

INVENTOR(S) : Sugawara et al

It is certified that error appears in the above-identified patent and that said Letters Patent is hereby corrected as shown below:

Col. 1, line 27, after "and" insert --5,--.

Col. 3, line 25, delete "piece" and insert --pieces--.

Col. 4, line 61, delete "caries" and insert --carries--.

Col. 8, line 42, delete "pieces of";

line 43, before "error" insert --pieces of--.

Signed and Sealed this

Eleventh Day of June, 1991

*Attest:*

HARRY F. MANBECK, JR.

*Attesting Officer*          *Commissioner of Patents and Trademarks*